US008947090B2

(12) United States Patent
McGinley et al.

(10) Patent No.: US 8,947,090 B2
(45) Date of Patent: Feb. 3, 2015

(54) ELECTROMAGNET ASSEMBLY

(75) Inventors: John Vincent Mario McGinley, London (GB); Ian Robert Young, Wiltshire (GB)

(73) Assignee: Emscan Limited (GB)

( * ) Notice: Subject to any disclaimer, the term of this patent is extended or adjusted under 35 U.S.C. 154(b) by 580 days.

(21) Appl. No.: 13/126,570

(22) PCT Filed: Oct. 30, 2009

(86) PCT No.: PCT/GB2009/002585
§ 371 (c)(1),
(2), (4) Date: Jul. 27, 2011

(87) PCT Pub. No.: WO2010/049700
PCT Pub. Date: May 6, 2010

(65) Prior Publication Data
US 2011/0273177 A1 Nov. 10, 2011

(30) Foreign Application Priority Data
Oct. 31, 2008 (GB) .................................. 0820043.8

(51) Int. Cl.
*G01V 3/00* (2006.01)
*G01R 33/381* (2006.01)
*H01F 6/00* (2006.01)

(52) U.S. Cl.
CPC ............... *G01R 33/381* (2013.01); *H01F 6/00* (2013.01)
USPC ...................................................... 324/319

(58) Field of Classification Search
CPC ............... G01R 33/38; G01R 33/3806; G01R 33/3815; G01R 33/42

USPC .................................................. 324/300–322
See application file for complete search history.

(56) References Cited

U.S. PATENT DOCUMENTS

| 5,867,027 | A  | * | 2/1999  | Kawamoto | 324/322 |
| 6,285,188 | B1 | * | 9/2001  | Sakakura | 324/318 |
| 6,493,572 | B1 | * | 12/2002 | Su et al. | 600/422 |
| 6,701,177 | B2 | * | 3/2004  | Su       | 600/422 |
| 6,701,178 | B2 | * | 3/2004  | Su et al. | 600/422 |
| 6,751,496 | B2 | * | 6/2004  | Su et al. | 600/422 |

(Continued)

FOREIGN PATENT DOCUMENTS

| EP | 0676647 A1 | 10/1995 |
| GB | 2355799 A  | 5/2001 |

(Continued)

OTHER PUBLICATIONS

International Preliminary Report on Patentability, dated May 12, 2011 of International Application No. PCT/GB2009/002585, filed: Oct. 30, 2009.

(Continued)

*Primary Examiner* — Dixomara Vargas
(74) *Attorney, Agent, or Firm* — Kaplan Breyer Schwarz & Ottesen, LLP

(57) ABSTRACT

An electromagnet assembly comprises a first pair of substantially co-planar coils wound in opposite senses to each other. It further comprises a second pair of co-planar coils also wound in opposite senses to each other. The coil pairs are arranged substantially parallel to, and spaced apart from, each other. In use, the field shape and direction produced by the first coil pair are substantially mirrored by those produced by the second coil pair.

12 Claims, 10 Drawing Sheets

(56) References Cited

U.S. PATENT DOCUMENTS

| | | | |
|---|---|---|---|
| 6,831,463 B1 | 12/2004 | Pulyer | |
| 6,975,115 B1 | 12/2005 | Fujita et al. | |
| 7,116,195 B2 * | 10/2006 | Vittorio | 335/216 |
| 7,972,371 B2 * | 7/2011 | Martin | 623/1.15 |
| 8,035,382 B2 * | 10/2011 | Devries et al. | 324/318 |
| 8,198,893 B2 * | 6/2012 | Fath et al. | 324/309 |

FOREIGN PATENT DOCUMENTS

| | | |
|---|---|---|
| JP | H07303621 A | 11/1995 |
| SU | 1804616 A3 | 2/1991 |
| WO | 9207279 A1 | 4/1992 |
| WO | 0131358 A1 | 5/2001 |

OTHER PUBLICATIONS

"International Patent Application No. PCT/GB2009/002585", "International Preliminary Report on Patentability and Written Opinion", May 12, 2011, Publisher: PCT, Published in: CH.

"International Patent Application No. PCT/GB2009/002585", "International Search Report", Jan. 20, 2010, Publisher: PCT, Published in: EP.

"Related GB Application No. GB0820043.8", "Search Report", Feb. 10, 2009, Publisher: UK IPO, Published in: GB.

* cited by examiner

ELECTROMAGNET ASSEMBLY

FIELD OF THE INVENTION

The present invention relates to an electromagnet assembly, particularly an electromagnet of the kind intended for producing very high intensity magnetic fields such as may be used in a magnetic resonance imaging (MRI) system. However, it is also applicable to other high field applications such as nuclear magnetic resonance spectrometry (NMR), electron spin resonance spectroscopy (ESR) or general physics laboratory research.

BACKGROUND OF THE INVENTION

It is known that when some anisotropic materials with an appropriate molecular conformation are excited in a magnetic resonance experiment, the primary relaxation mechanism is dipolar coupling. It is further known that theory predicts that there is an optimum angle θ of primary field orientation of the main field relative to the object in order to obtain the strongest signal corresponding to the longest $T_2$ relaxation rate (as the term $3 \cos^2 \theta - 1$ in the theoretical relationship goes to zero). The value of θ at which this occurs (around 54.7°) is sometimes referred to as the 'magic angle'. Tendons are one such example in a medical application. However, similar considerations apply with non-medical anisotropic subjects.

The basic physics of this phenomenon is extensively described in Abragam A. The Principles of Nuclear Magnetism. Oxford University Press, Oxford, UK. 1961; Chapter IV. It was described in the context of MRI, using excised tissue, in Fullerton G D, Cameron I L, Ord V A, Orientation of tendons in the magnetic field and its effect on T2 relaxation times. Radiology 1985; 155(2):433-435. An account of the effect in vivo was reported in Oatridge A, Herlihy A H, Thomas R W et al. Magnetic resonance: magic angle imaging of the Achilles tendon, The Lancet 2001; 358(9293):1610-1611.

A conventional MRI machine has an annular magnet bore or employs a C-shaped yoke, such as shown in GB-A-2 282 451, so that the subject is positioned between the pole pieces at the end of the 'C'. In such conventional situations, the space for positioning the patient or part of the patient is typically no more than about 60 cm across. It can therefore be appreciated that when it is necessary to orient the part of the patient at an optimum angle, the room for manoeuvre can be very limited, e.g. when taking image slices of joints such as knees or shoulders. At the very least, this can cause severe patient discomfort and at worst, the optimum orientation can be impossible to achieve.

In the case of the C-shaped yoke, the situation would be considerably improved if the whole magnet assembly could be pivoted relative to the patient. However, this is not really possible in view of the size and more particularly, the weight of the apparatus.

A novel form of electromagnet assembly has now been devised which is sufficiently light to enable it to be moved, and in particular oriented relative to the subject or patient so that the optimum angle is much more easily achieved. In this arrangement, each of a pair of coplanar coils is wound in opposite sense to the other and coils in a second coplanar pair, parallel to the first pair, are wound likewise but in mirror sense thereto.

Use of planar gradient coils in an MRI machine is known from U.S. Pat. No. 5,867,027 and SU-A-1804616. Pairs of coplanar r.f. coils are disclosed in U.S. Pat. No. 6,975,115 and JP-A-7303621.

GB-A-2 355 799 discloses an electromagnet assembly having a pair of main windings whose currents in the upper and lower planes are in opposite senses to achieve a main field parallel to the plane of the coils. Each plane of the main field coils is a pair with mirror symmetry about the X axis giving automatic symmetry about the Z=0 plane. With the present invention, the main field generating elements are parallel and in the same sense creating an efficient generation of net field. In contrast, the arrangement described in GB-A-2 355 799 has neighbouring elements in opposite senses and so tend to cancel, making it very inefficient. In a particularly preferred class of embodiments of the present invention there is an additional plane of symmetry about the Z=0 plane (in the axis labelling notation employed herein, equivalent of plane X=0 in OMT's notation) which is extremely valuable in creating an intrisically homogeneous magnet. All field-creating elements nearest the isocentre in all 8 octants of 3d space generate field in the same sense.

DEFINITION OF THE INVENTION

In its broadest aspect, the present invention now provides an electromagnet assembly comprising a first pair of substantially co-planar coils wound in opposite senses to each other and a second pair of co-planar coils also wound in opposite senses to each other, the coil pairs being arranged substantially parallel to and spaced apart from each other such that in use, the field shape and direction produced by the first coil pair are substantially mirrored by those produced by the second coil pair.

DETAILED DESCRIPTION OF THE INVENTION

The required field shape and direction is achieved by virtue of the coils in each pair being wound with the opposite sense to each other and with mutually facing coils of the respective different pairs also being wound in opposite sense to each other. The planes of each pair are substantially parallel to but spaced apart from each other. Preferably, the axes running through mutually facing coils of each pair are also substantially parallel to each other.

The coils in each pair are substantially coplanar. That means that they are generally planar (e.g. square, rectangular, circular, elliptical etc) but have finite thickness, eg with a ratio of maximum diameter, major axis or diagonal to thickness at from 10 to 200, preferably from 30 to 80. The coils in each pair also most preferably lie in the same plane as each other. However, each may be slightly angled, for example the coils in each pair may be angled outwardly of the plane of symmetry of the whole coil structure, from the mid-point or mid-line between the coils in a given pair towards the end of the coil pair, or they may be angled inwardly. For example, the plane of any or each coil may deviate by up to 10° but preferably no more than 5°, still more preferably no more than 1° from a notional common horizontal plane.

The coils may be wound upon, and/or encapsulated in, a non-ferromagnetic substrate, for example a resin such as epoxy. A former on which the coils are wound may also comprise a non-ferromagnetic metal such as aluminium, magnesium or an aluminium alloy or magnesium alloy or stainless steel.

In order to improve field homogeneity, preferably at least one coil in either or both coil pairs is associated with one or more satellite coils. Preferably, these satellite coils are closely physically associated with the respective main coil in one of the coil pairs. In a most preferred configuration, both coils in both coil pairs are provided with two satellite coils. For field symmetry, it is preferred for the two satellite coils of each main coil to be substantially diametrically opposite to each other, relative to the associated main coil. Most preferably, they are situated opposite each other either side of the axis of main field flux.

Fine-tuning of field homogeneity may also be assisted by locating one or more small ferromagnetic pieces (shims) or pieces of permanent magnets within, or just out of, the plane of one or both coil pairs, e.g. in the vicinity of the boundary between the coils in one or both pairs. In general permanent magnets could also be used in any orientation.

Field homogeneity may be assisted by the shape of the coils themselves. Viewed from above or below, they may be generally square, rectangular, circular or cylindrical. However, they may narrow and/or have one or more re-entrant sections, particularly in the region facing the other coil in the pair. The same configurations may be employed in the gradient coils.

The satellite coils may constitute separate windings independently connected to a power supply but advantageously, each satellite coil is wound contiguously in series with and in the same sense as, the coil with which it is associated.

An MRI machine further requires gradient coils. Advantageously, each coil pair has closely physically associated therewith, respective substantially planar x, y and z gradient coils. Preferably, the planes of the gradient coils are substantially parallel to the planes of the coil pairs with which they are associated.

The total number of turns in the main coils are preferably in the range 1,000-2,000. The number of turns in each satellites coil would be in the range 150-300 turns. A typical number of turns for a gradient coil would be 10-20.

The coils of the electromagnetic assembly according to the invention are intended as 'main field' coils. Such as for an MRI or ESR machine and in use, are connected to a main field power supply.

In order to generate a strong magnetic field for MRI or similar high field applications, preferably the coils of the coil pairs comprise superconducting material. In that case, the coil pairs may be mounted on metallic mounts which may be arranged to be cooled using a cryogenic cooling system, e.g. coupled to one end of each mount.

Preferably superconducting coils are provided with a suitable cooling means. For reasons of size and efficiency, particularly preferred are coils made from one or more low temperature superconductors (LTS) such as the Nb-based alloy (most commonly Nb-47 wt. % Ti) or A15 ($Nb_3Sn$ and $Nb_3Al$), although single element LTS materials such as lead or mercury may also be used.

However, in some applications where size and manoeverability are less important, it is in the alternative possible to employ coils made from one or more high temperature superconductor (HTS) materials. By 'high temperature superconductor' is meant a material which demonstrates superconductivity at a temperature above 10° K. Alternatively, 'high temperature superconducting material' may also be interpreted to mean a material with a superconducting working temperature operating as a magnet of above 10° K. That is because for many of these materials, the onset of superconductivity in the characteristic curve of the superconductor is not very sharp.

Therefore, lower temperatures than the highest at which superconductivity is first demonstrated are preferred for better performance. A particularly preferred high temperature superconductor is magnesium diboride ($MgB_2$) or $MgB_2$ doped with another suitable material such as silicon carbide, hosted in a matrix of copper. Other suitable high temperature superconductors include niobium nitride, niobium carbide, niobium boride and molybdenum diboride, although these materials require lower temperatures than $MgB_2$. Yet other high temperatures superconductors which could be used include NbTi, NbSb, bismuth strontium calcium copper oxide (BSCCO) and yttrium barium copper oxide (YBCO) which have a higher critical temperature but are generally less suited to high current density and long wire applications, as well as being more expensive.

The entire coil assembly may be moveable linearly and/or rotationally relative to the patient bed. Additionally or alternatively, the bed may be moveable linearly and/or rotationally relative to the coil assembly. One or both of the upper and lower coplanar coil pairs may be linearly and/or rotationally moveable. In all cases, suitable motive means, optionally computer controllable motive means, may be employed for these purposes. Precise field orientation relative to the target of interest may thereby be achieved.

Any electromagnet or electromagnet assembly according to any single aspect of the present invention may incorporate any one or more essential, preferred or specifically described features of any electromagnet or electromagnet assembly according to any one or more of the other aspects of the invention. The present invention also extends to a machine, in particular an MRI, NMR or ESR machine comprising an electromagnet or electromagnet assembly according to the invention. These machines may also comprise the requisite r.f. coils (transmitter and receiver coils) or the r.f. coils may be part of a free-standing separate unit. An MRI machine will normally also include gradient coils. As used herein, the term MRI includes fMRI (functional magnetic resonance imaging).

BRIEF DESCRIPTION OF THE DRAWINGS

The present invention will now be explained in more detail by way of the following description of preferred embodiments and with reference to the accompanying drawings, in which.

DESCRIPTION OF PREFERRED EMBODIMENTS

Figure 1:
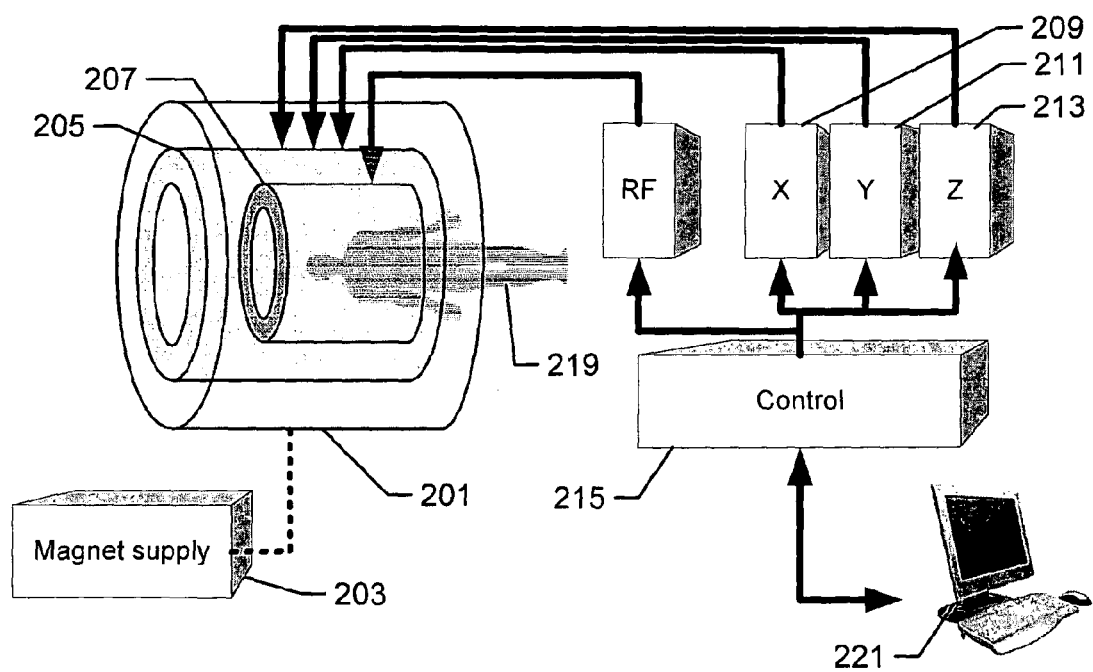
FIG. 1 shows a block diagram of a conventional MRI machine.

FIG. 1 of the accompanying drawings shows a block diagram of a conventional MRI machine.

In FIG. 1, reference numeral 201 represents an annular main field magnet coil which is typically a superconducting magnet cooled by a cryocooler (not shown) and is energised by a main field power supply 203 though, in persistent mode, this may be disconnected. Within the main field coil are arranged annular x, y and z gradient coils shown as a combined gradient coil structure 205. Within the gradient coil structure is arranged an rf transmitter/receiver (tx/rx) arrangement 207.

The gradient coils are connected to respective x, y and z power supplies 209, 211, 213. A control unit 215 controls the (tx/rx 207 and the gradient coil power supplies 209, 211, 213 so that the gradient fields are swept in known manner to produce MRI image slices of a patient 219 placed inside the annulus of the coil structure. The resultant signal is processed by the control unit 215 to show the slice images on a display 221.

In the following description of preferred embodiments of the invention, the following convention is used. The x axis is the axis parallel to the plane of the coils but orthogonal to the direction of the main field between the coils in each pair. The y axis is the axis orthogonal to the plane of the coils. The z axis is the axis which is parallel both to the plane of the coils and to the direction of the main field between the coils in each pair (eg as annotated in FIGS. 2 and 3), which are described in more detail hereinbelow.

Figure 2:
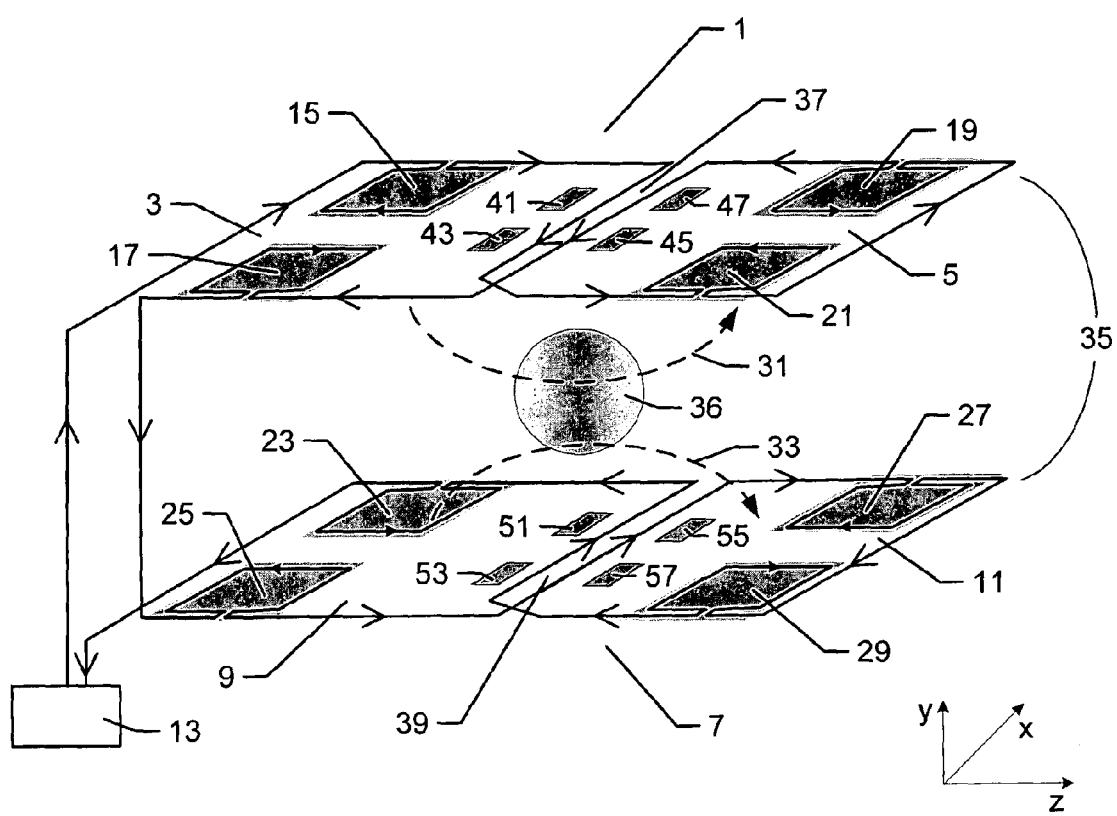
FIG. 2 shows a schematic diagram of the main coils and satellite coils of an embodiment of an electromagnet assembly according to the present invention.

FIG. 2 shows a schematic view of an electromagnet assembly according to the present invention. This shows the form of an assembly with two principal pairs of coplanar coils wound in opposite senses to produce the field indicated. The configuration means that the forces between the poles, though still substantial, are repulsive. It also shows satellite windings and iron parts which are used to help shape the field. A much smaller uniform diameter spherical volume (DSV) than is conventional can be used and one such embodiment produces a DSV (at ±5 ppm after shimming) of 250 mm, with the option of smaller, ellipsoidal and irregularly shaped volumes that are acceptable in many procedures (such as biopsy). These may be generated by windings (not shown) which can be operated using superconducting switches. For more important medical applications, the patient axis will be parallel to the smallest dimension of the magnet, i.e. parallel to the X direction, so allowing maximum access to the patient when imaging is proceeding.

As shown, an upper coil pair 1 comprises a left hand coil 3 and a right hand coil 5. Situated below and spaced apart from the upper coil pair 1 is a lower coil pair 7 which comprises a left hand coil 9 and a right hand coil 11. The left hand coil 3 and the right hand coil 5 of the upper coil pair 1 are wound with opposite senses to one another. The left hand coil 9 and right hand coil 11 of the lower coil pair 7 are also wound with opposite senses to each other. However, the winding sense of the left hand coil 3 of the upper coil pair and that of the left hand coil 9 of the lower coil pair 7 are of opposite sense. Similarly, the right hand coil 5 of the upper coil pair 1 and the right hand coil 11 of the lower coil pair 7 are also wound with the opposite sense as each other. The coils in each pair are wound in series with each other and the two coil pairs are also connected in series. The whole coil assembly is connected to a power supply 13, or can be operated in persistent mode with power supply disconnected.

The main coils 3, 5, 9, 11 are wound with straight sides and are approximately square, each having two sides substantially parallel to the axis of symmetry through each coil pair 1, 7 respectively.

The coils can in general be wound in a distributed fashion so that bundles of turn are peeled off at different values of Z along the coil. Another useful feature is a chicane winding where part of the turn is parallel to Z and therefore not contributing to B. The sides may also be 'radiused' so as to have outward curvature. Examples of such configuration are described in more detail hereinbelow.

Each of the individual main coils 3, 5, 9, 11 of the assembly are provided with respective satellite coils denoted by reference numerals 15, 17 (for the left hand coil 3 of the upper pair 1), 19, 21 (for the right hand coil 5 of the upper pair 1), 23, 25 (for the left hand coil 9 of the lower pair 11) and 27, 29 (for the right hand coil 11 of the lower pair 7). The satellite coils of each pair are positioned diametrically opposite each other with respect to the main coil with which they are associated. Thus, by way of example, satellite coils 15 and 17 of the upper left hand coil 3 are located at either side of the windings of that coil (3) relative to the left-to-right symmetry through the two coils 3, 5 of the upper pair 1. The satellite coils of the other main coils are similarly positioned. Each of the satellite coils is approximately rectangular having sides substantially parallel to those of the main coils 3, 5, 9, 11 with which they are respectively associated.

Though it is possible to implement the main magnet concept at low field, perceptions amongst MRI system users are such that the minimum acceptable field is 0.5 Tesla in which case, the magnet must be superconducting. The capability and cost of high temperature superconducting (HTSC) cable tends to be compatible with a practical magnet but this particular described embodiment is based on conventional LTSC wire. It should be noted that the manufacture of straight sided coils is much more difficult than conventional circular windings, largely because the stresses in the wire try to make it take up a circular form. In view of the need to rotate and move one coil system relative to the other, in this embodiment, the cryostats for the two coil systems are independent of each other. Two separate cold heads may be included (though fed by a single compressor). Alternatively a simple refrigeration unit may be used. Although one cryostat operates at different orientations, it will never have to do so while "at field".

The upper coil pair 5 produces a flux with a curved direction from the left hand coil 3 to the right hand coil 5 as denoted by curved broken arrow 31. Similarly, the lower coils 7, 9 of the lower pair 11 produce a left-to-right field, i.e. with a direction shown by the broken arrow 33. The two coil pairs 5, 11 are thus substantially parallel to each other and are separated by a gap denoted 35. The fields produced by the two coil pairs have substantially the same shape and the same direction as each other and are symmetrical, i.e. as "mirror images", around a plane of symmetry which lies midway between the plane of the upper coil pair 1 and the lower coil pair 3.

The homogeneity of the field in a target volume at the centre of the coil pair, denoted by the shaded area 36 is enhanced by the satellite coils which are appropriately dimensioned, including with the appropriate number of turns. These coils are wound in series, and therefore are contiguous with, the main coils with which they are associated and are wound with the same sense as those coils.

Field homogeneity is further aided by iron shaping pieces or permanent magnets which are located within the plane, or just outside the plane, of each main coil 3, 5, 9, 11 and are placed in the vicinity of the boundaries 37, 39 respectively between the coils in each pair. These iron shaping pieces are denoted, respectively, for the left and right hand coils of the upper pair and left and right and coils of the lower pair by numerals 41, 43, 45, 47, 49, 51, 53 and 55. Iron shaping pieces are magnetized parallel to the main field in the z direction. However these could also be replaced by permanent magnets which are magnetized in any general orientation.

Within, or just outside the plane of each coil pair are located respective planar gradient coils. These are shown schematically in FIG. 2. It should be noted that, precisely, although the gradient coils are labelled as being the X, Y and Z gradient coils, the actual relevant field components are in all cases parallel to the Z direction (which is that of the main field) so that the gradient fields are, actually, mathematically $$\frac{\partial G_{xz}}{\partial x}, \frac{dG_{yz}}{dy}, \frac{\partial G_{xy}}{\partial z}$$

where, for example, $G_{xz}$ is the Z component of the X gradient field.

Two of the three gradient coil systems which are necessary for this magnet configuration are relatively simple. The main field direction is labelled Z, X is the gradient in the other horizontal direction and Y is the gradient in the vertical direction. The gradient coils may be actively shielded in order to minimise eddy current effects in the magnet structure. Typically, the shielding is designed to reduce the gradient field at its rear surface to less than 1% of the unshielded level. While the main gradient coils and shielding are mounted close to the magnet poles, it can frequently be convenient to employ smaller, insert, coils to generate much larger and/or faster switching gradient fields for some investigations. The shielding is arranged to shield both main and any insert gradient coils. The gradient coils are designed so that the inner, active, windings can be replaced with insert units. The full size windings may be capable of a rated gradient field along each axis of 50 mT/m, and rise times of 100 μsec (0 to 90%). The insert gradient unit might have somewhat less than half the distance between the gradient unit faceplates, and could have a strength of 200 mT/m, with the same rise times.

Figure 3:
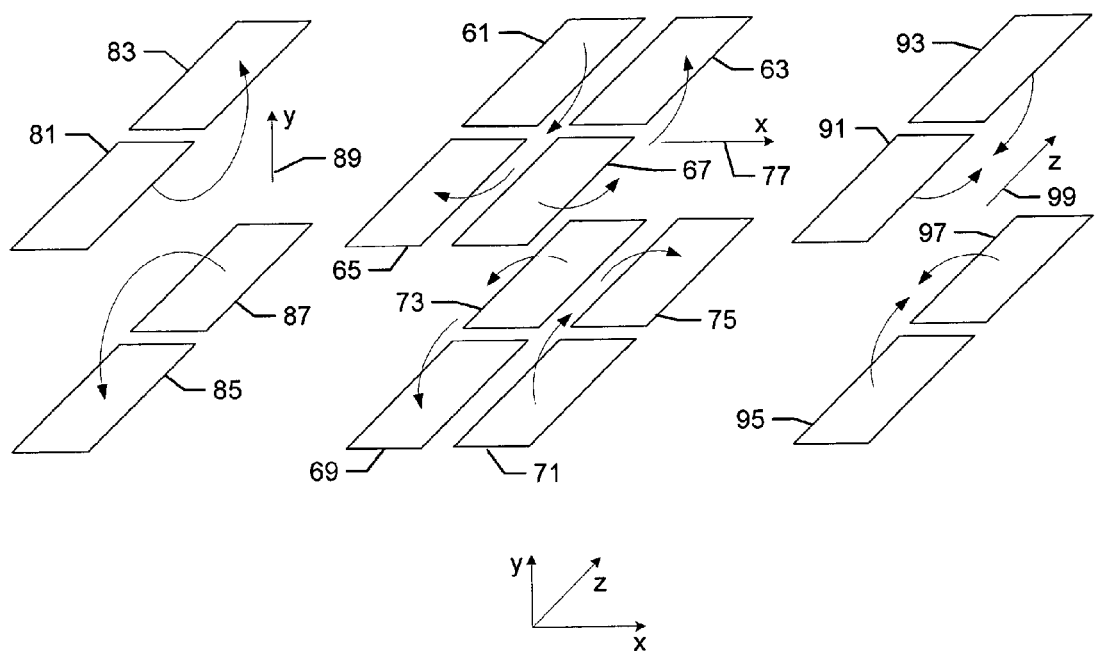
FIG. 3 is a schematic diagram showing the arrangement of gradient coils for the embodiment of FIG. 2.

Referring to the detail of FIG. 3, the X gradient is provided by four coplanar upper coils 61, 63, 65, 67 and four coplanar lower coils 69, 71, 73, 75. In each case (upper or lower), the fields are symmetrical with respect to the target area but are directed so as to have opposing polarities. The same applies to the two pairs of coils in the lower pair. However, the polarities are the same as compared between the two left hand coils in the lower X gradient pair as compared with those in the left hand upper gradient pair directly facing them and similarly, the polarities are in the same direction for the coils of the upper and lower right hand pairs. The resultant field of gradient is shown by the arrow 77, the magnitude being determined as the voltage supply to the X gradient poles is swept.

The Y gradient coils consist of a single coplanar upper and lower pair of gradient coils, the polarity direction of the upper pair being opposite to that of the lower pair. The upper pair in this Figure are denoted by numerals 81, 83 and the lower pair of the Y gradient coils by numerals 85, 87. The direction of the overall Y gradient field is denoted by the numeral 89.

In the case of the Z gradient coils, these are also upper and lower coplanar pairs, the upper two coils being denoted by numerals 91, 93 and the lower pair by numerals 95, 97. The arrow 99 denotes the overall Z gradient field direction. In the case of the Z gradient coils each of the co-planar pairs is arranged so that their polarities oppose but the sense of the polarities is the same in both of the co-planar pairs. That is, the fields produced by the left hand members of each pair are towards the other left hand coil and the same is true of the right hand members.

The whole magnet assembly may be considered to comprise two parts, i.e. upper and lower, each comprising the main coil pairs 1, 7 with their respective satellite coils and gradient coils. In this particular embodiment, the two parts are positioned relative to each other using a mix of hydraulic and piezoelectric actuators. A rule of thumb is that a 1 μm deviation in position in a typical MRI system corresponds to an error of 1 ppm in the field. The requirement is to locate the two parts to within about 10 μm in this way. The actual position of the cryostats relative to defined end stops is measured to an accuracy of a fraction of a micron, and the locations of the stops relative to each other are also determined. An array of six NMR probes is provided in the bed carrying beam just below the machine centre (not shown). The signals from these, in conjunction with the measurements just mentioned, comprise the control signals for adjusting the array of iron segments which are carried on servo-controlled trays just outside their respective cryostats.

An alternative method is to calibrate the control system by recording the effect of many repositioning trials taken during system commissioning and use these patterns as the guidance for the initial control steps. As the system approaches the target positions, it becomes easier to use direct proportional control.

The system thus described with respect to FIGS. 2 and 3 is designed to achieve good quality imaging (with a minimum of a 128×128 matrix) of tissue components with a T2* (i.e. the observed time constant of free induction decay in the presence of inhomogeneities) of less than 50 μsec (after a delay (TE) of 5 μsec at the maximum), and of non-clinical material with a T2* of less than 20 μsec (after a TE of 1 μsec). Since these targets can only really be achieved using gradient recalled echo sequences, T2* is more appropriate as a measure of performance than T2. The equivalent non-clinical full specification need only apply to a smaller volume of material. These times assume that no RF manipulation has been used, and that the acquisitions are as direct as is possible. The use of RF pre-pulsing has a greater impact on non-clinical applications, where safety is no longer an issue. Conventional machines have a minimum TE in the region of 500-800 μsec, and can handle materials with a minimum T2* of typically 5-10 msec.

The magnet is designed to open during interventional procedures at times when imaging is not required and the field is off, so that clinicians have total access to the patient. It can be ramped down very fast so that an X-ray unit can be slid into place instead of the MRI system. This should ideally be completed in less than 30 secs. The reverse process can take up to 5 minutes from the field being off to the system being operational. This unique feature of the magnet, designed to be operated at 0.5T, is combined with other equally different features. These include a main field direction which is parallel to the pole faces generating it, meaning that it is extremely easy to move the subject relative to the field direction so enabling the study of components where dipolar coupling is the dominant relaxation mechanism.

In human tissue this includes tendons, cartilage, peripheral nerves and many features of the spinal column. The magnet also includes facilities to allow the shape of the volume of good field (conventionally known as the DSV) to be manipulated, and to permit the magnet poles to be laid alongside the patient, with no obstruction above. Normally, this is an inefficient and expensive arrangement since if the magnet is kept tight to the patient the DSV covers the centre of the body only, whereas if whole body coverage is ensured, the magnet becomes excessively large and the patient is remote from the clinicians attending him/her. The volume will not be dynamically variable, but the DSV shape will be selected before it is ramped up. None of these capabilities are believed to exist in any known magnet.

Some possible variations in the main coil windings will now be described in detail. The homogeneity of the main field may be assisted if the main field coils 3, 5, 9, 11 have windings of graded different dimension.

Figure 4:
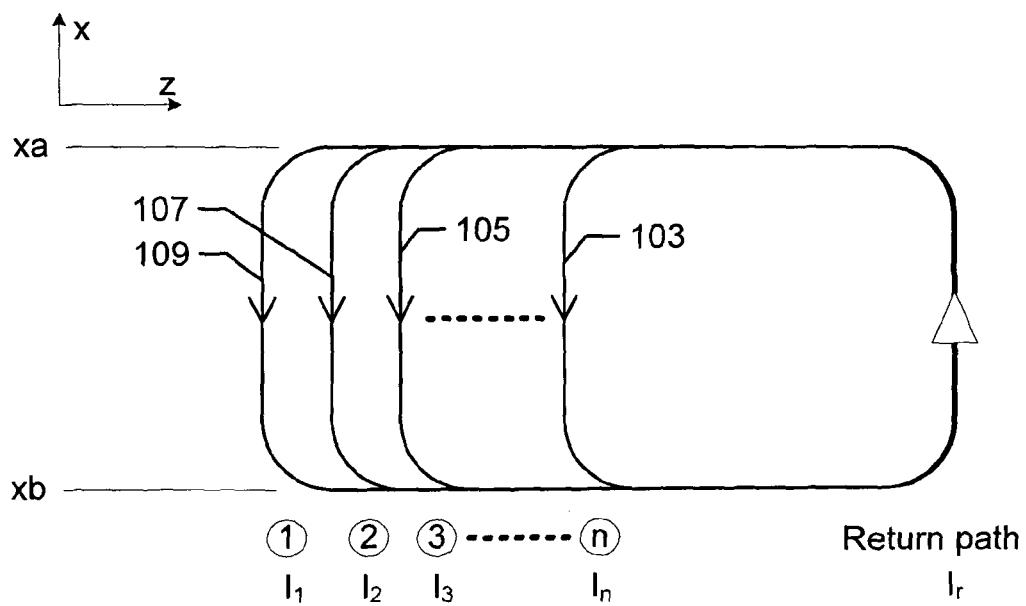
FIG. 4 shows a schematic diagram of a possible arrangement of coils with windings of different size.
Figure 4:
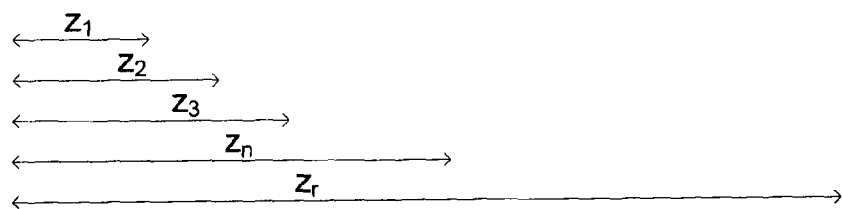

FIG. 4 shows a rectangular coil 101 which is of generally square or rectangular shape. However, the width of the coil in the Z direction varies so that individual windings, e.g. as shown by numerals 103, 105, 107 and 109 are of increasing width in the Z direction extending in the direction of the other coil in the same coplanar pair.

Figure 5:
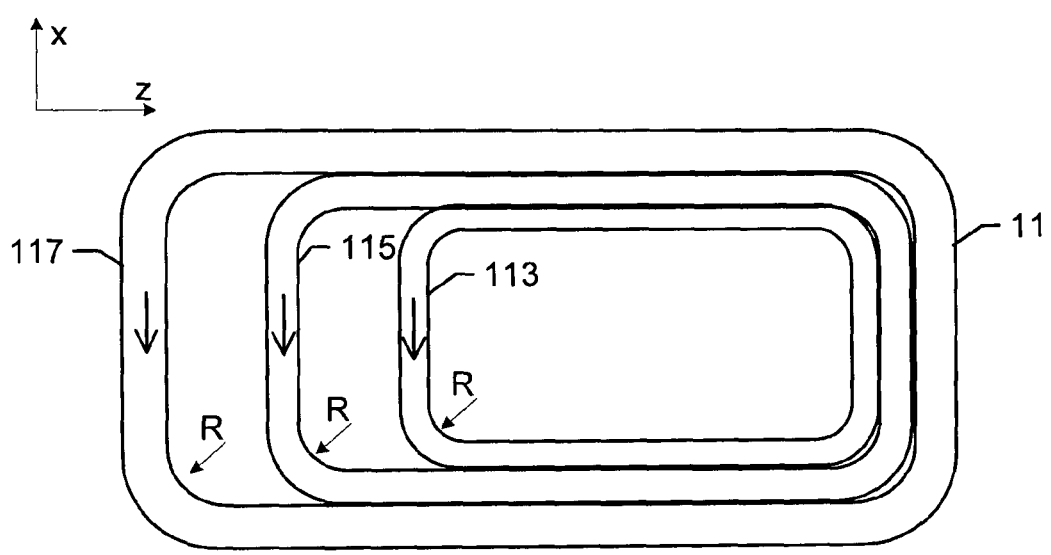
FIG. 5 shows a schematic diagram of a possible arrangement of coils with groups of windings of different size.

In FIG. 5, it can be seen that another arrangement would entail a square or rectangular coil 111 which comprises pairs or groups of windings denoted, respectively, 113, 115, 117 have different widths in the Z direction.

In FIGS. 4 and 5 the width of each arm of the coil is proportional to the number of ampere turns in each arm. As all elements of the coil are run in series the widths are proportional to the number of turns and so are in integer ratios.

Figure 6:
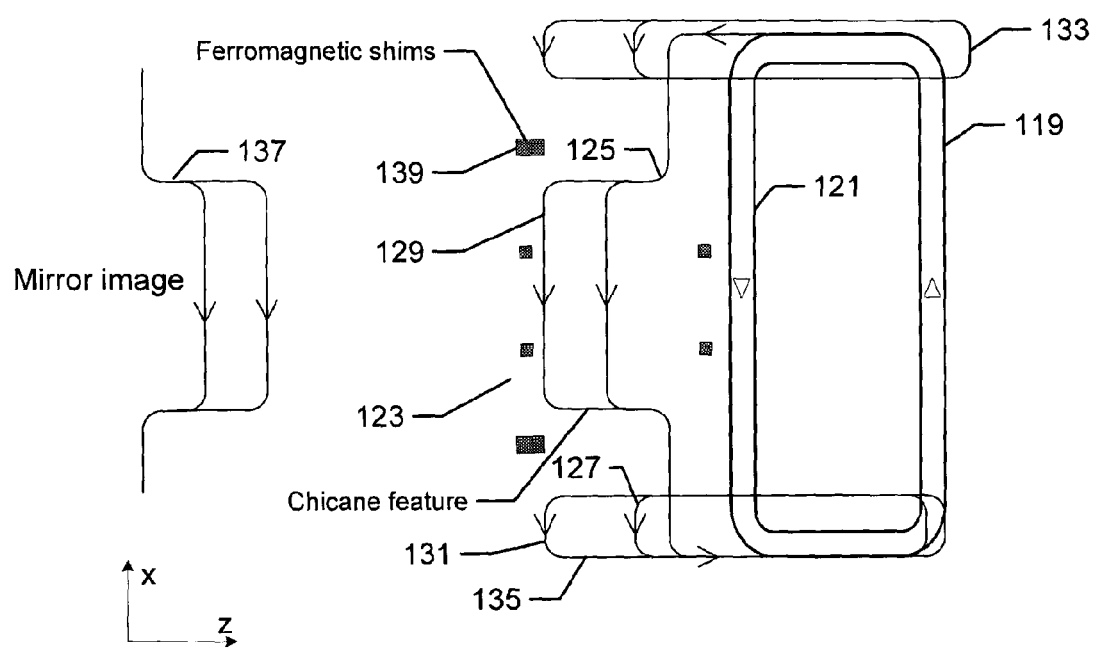
FIG. 6 shows one possible arrangement of coil windings with deviations from a regular shape.

Another possible variation which can aid main field homogeneity is shown in FIG. 6. Here, a rectangular coil 119 has a main winding or windings denoted 121 of a generally rectangular configuration but as other winding or windings progressively widen in the Z direction towards the other coil in the same pair, there is a chicane feature 123 wherein those other windings are narrower in the X direction in the midpoint thereof, respectively having re-entrant corners 125, 127 and convex corners 129, 131. Preferably, small satellite coils as denoted by numerals 133, 135 are also provided overlapping the main part of the coil 121 and extending over that part of the remaining windings where the narrowed windings of the chicane feature 123 do not extend. The other coil of the pair (shown in part) 137 is in mirror formation. The small dark objects 139 etc represent ferromagnetic shims (not shown for the mirror coil 137).

Figure 7:
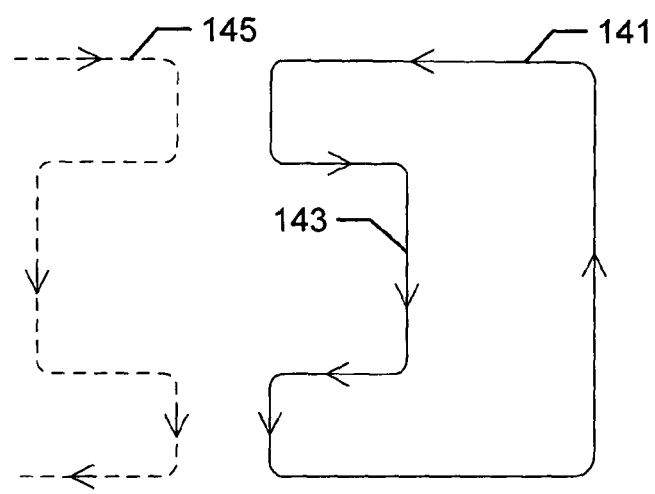
FIG. 7 shows another possible arrangement of a coil having windings with deviations from a regular shape.

A variation on the arrangement of FIG. 6 is shown in FIG. 7 wherein another coil 141 is of generally rectangular shape but has a major re-entrant section 143 in the midpoint of the side facing the adjacent coil of the pair. Again, the configuration of the other coil (part shown) 145 in the pair is essentially a mirror image of the first coil 141.

Figure 8:
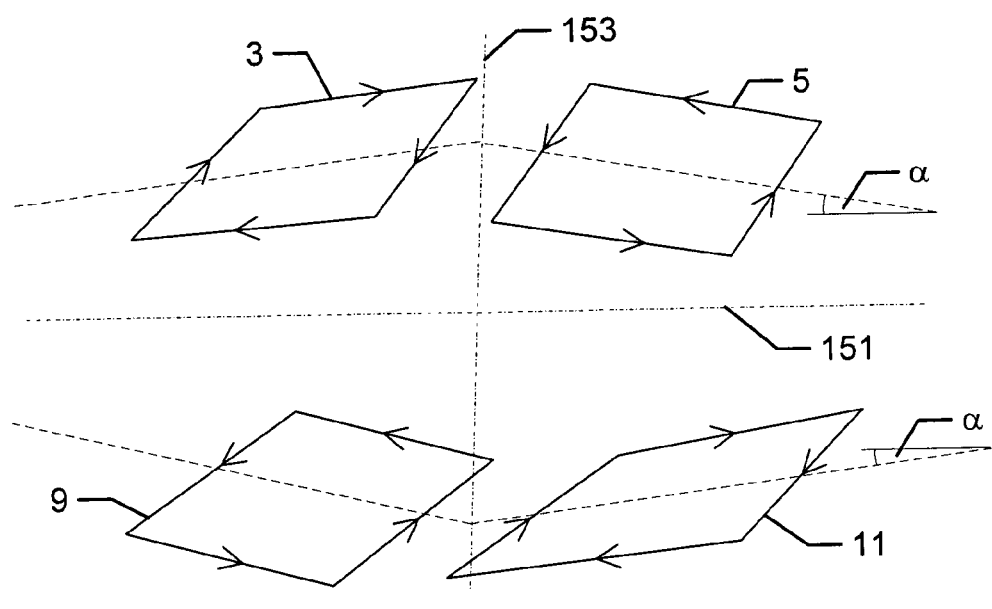
FIG. 8 shows one possible arrangement wherein the coils in each pair deviate slightly from coplanar alignment.

FIG. 8 shows that the coils 3, 5, 7, 9 of the main coil pairs may not be absolutely coplanar. The dotted line 151 indicates the plane of symmetry in the Z direction. The dotted line 153 denotes a line passing between the coils in each pair, orthogonal to the line 151. Starting from the midpoint 153, the plane of the coils in the upper pair 3, 5 slopes inwardly slightly at an angle α of approximately 5° towards the said axis symmetry 151, specifically sloping away from the midpoint 153. The same applies to the lower coil 7, 9.

Figure 9:
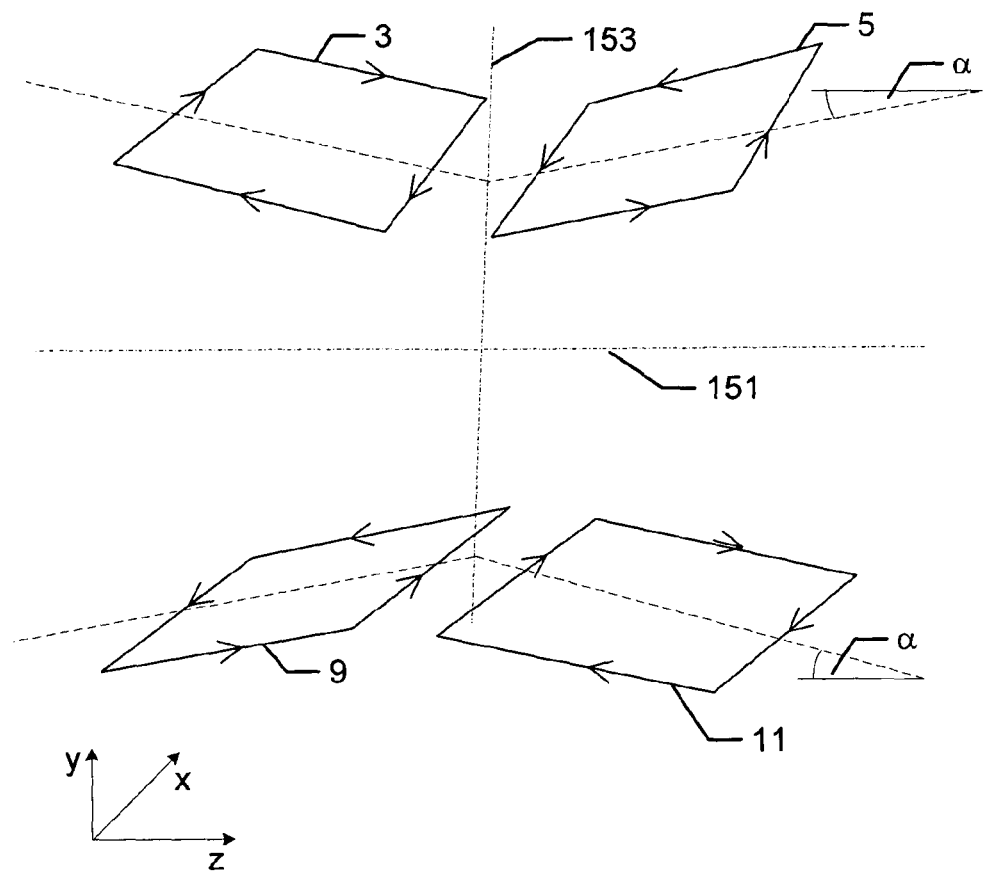
FIG. 9 shows another possible arrangement of coils in each pair deviating from coplanar alignment.

As shown in FIG. 9, the converse arrangement is shown wherein the angle α is about 5° relative to the line or plane of Z symmetry 151 but starting from the midpoint 153, the coils extend outwardly in the Y direction.

Such angling as shown in FIGS. 8 and 9 may assist field homogeneity and/or dimensioning but in any event, shows that the coils in each pair do not have to be totally coplanar. The amount of deviation from coplanarity could be up to 5° or up to even 10° or in exceptional cases, even more but the precise degree of deviation would depend on the particular requirements and constraints of any specific embodiment.

Figure 10:
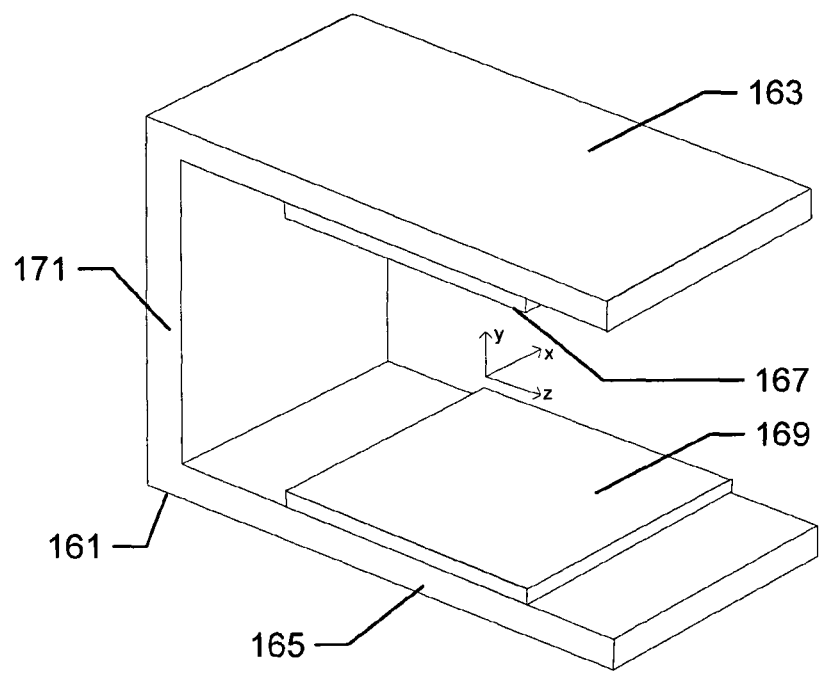
FIG. 10 shows a perspective view of an MRI machine incorporating the embodiments of FIGS. 2 and 3.

FIG. 10 shows the overall structure of a complete MRI scanner embodying the electromagnet configuration depicted schematically in FIGS. 1 and 2. As shown in this Figure, a unitary structure 161 comprises an upper main coil structure 163 and a lower main coil structure 165 for the upper coil pair and lower coil pair respectively, e.g. as shown in FIG. 1. Upper gradient coils 167 and lower gradient coils 169 face inwardly between the upper and lower structures 163, 165. At one end of the those structures, they are joined and held apart by a non magnetic support 171 incorporating cryostat and electrical interconnects between the upper and lower coil sets. The cryostat interconnects join the cryostatic cooling incorporated in the upper and lower main coil support structures 163 and 165.

In light of the described embodiments, modifications of those embodiments, as well as other embodiments, for example as defined by any one or more of the appended claims, will now become apparent to persons skilled in the art.

What is claimed is:

1. An MRI machine comprising an electromagnet assembly comprising a first pair of substantially co-planar main field coils and a second pair of co-planar main field coils, the coils of the coil pairs comprising superconducting material and the coil pairs being arranged substantially parallel to and spaced apart from each other to define a target area therebetween, wherein the main field coils in each pair are adjacent to each other, each main field coil including a left hand coil or a right hand coil respectively and are operatively configured so that resultant fields are symmetrical with respect to the target area around a plane of symmetry which lies midway between the plane of the first main field coil pair and the second main field coil pair and directed so as to have opposing polarities with the field shape and direction produced by the first main field coil pair being substantially mirrored about said plane of symmetry by those produced by the second main field coil pair.

2. An MRI machine according to claim 1, wherein mutually facing parallel coils respectively in the first and second coil pairs are wound with the opposite sense.

3. An MRI machine according to claim 1, wherein at least one coil in either or both main field coil pairs is associated with one or more satellite coils for enhancing field homogeneity.

4. An MRI machine according to claim 3, wherein both coils in both main field coil pairs are provided with two satellite coils.

5. An MRI machine according to claim 4, wherein the two satellite coils of each coil are situated substantially diametrically opposite each other.

6. An MRI machine according to claim 3 wherein each said satellite coil is wound contiguously in series with and with the same sense as the main field coil with which it is associated.

7. An MRI machine according to claim 1 wherein one or more ferromagnetic members and/or permanent magnets is or are located within, or just out of, the plane of one or both main field coil pairs.

8. An MRI machine according to claim 1, wherein each coil pair has closely physically associated therewith, respective substantially planar x, y and z gradient coils.

9. An MRI machine according to claim 8, wherein the planes of the gradient coils are substantially parallel to the planes of the coil pairs with which they are associated.

10. An MRI machine according to claim 1, wherein the main field coils are connected to a main field power supply.

11. An MRI machine according to claim 1, wherein the main field coil pairs are mounted on metallic mounts and the metallic mounts are arranged to be cooled by a cryocooling system.

12. An MRI machine according to claim 1 wherein the main field coil pairs are independently or together moveable relative to a patient bed.

* * * * *